United States Patent
Cambrea et al.

(10) Patent No.: US 9,279,915 B1
(45) Date of Patent: Mar. 8, 2016

(54) SELF PATTERNING PLASMONIC ARRAY STRUCTURES

(71) Applicant: THE UNITED STATES OF AMERICA AS REPRESENTED BY THE SECRETARY OF THE NAVY, Washington, DC (US)

(72) Inventors: Lee R. Cambrea, Ridgecrest, CA (US); Zachary A. Sechrist, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/943,004

(22) Filed: Jul. 16, 2013

Related U.S. Application Data

(60) Provisional application No. 61/672,567, filed on Jul. 17, 2012.

(51) Int. Cl.
| | |
|---|---|
| *G01J 3/44* | (2006.01) |
| *B32B 3/22* | (2006.01) |
| *G02B 5/00* | (2006.01) |
| *H01B 13/00* | (2006.01) |

(52) U.S. Cl.
CPC ............ *G02B 5/008* (2013.01); *H01B 13/0036* (2013.01)

(58) Field of Classification Search
USPC .......................................... 356/301; 428/201
See application file for complete search history.

(56) References Cited

U.S. PATENT DOCUMENTS

| | | | | |
|---|---|---|---|---|
| 8,212,273 | B2 * | 7/2012 | McKenzie | H01L 33/20 257/98 |
| 8,501,406 | B1 * | 8/2013 | Gray | B01J 19/0046 435/283.1 |
| 2011/0128536 | A1 * | 6/2011 | Bond et al. | 356/301 |
| 2013/0192663 | A1 * | 8/2013 | Fonash et al. | 136/246 |
| 2013/0260113 | A1 * | 10/2013 | Hart | 428/201 |

* cited by examiner

*Primary Examiner* — Peter D Mulcahy
*Assistant Examiner* — Henry Hu
(74) *Attorney, Agent, or Firm* — Charlene A. Haley

(57) ABSTRACT

A selective area atomic layer deposition process and apparatus that can deposit conductive materials onto one homopolymer region in a diblock copolymer. The diblock copolymer generates a large area self assembled substrate with nanoscale homopolymer regions arrayed into predictable patterns. Combining these two technologies allows formation of plasmonic surfaces without expensive lithographic processing.

10 Claims, 4 Drawing Sheets

Poly(Acrylic Acid) Sodium Salt

Poly(Acrylic Acid)

SELF PATTERNING PLASMONIC ARRAY STRUCTURES

CROSS-REFERENCE TO RELATED APPLICATIONS

This is a non-provisional patent application, claiming the benefit of parent application Ser. No. 61/672,567 filed on Jul. 17, 2012, whereby the entire disclosure of which is incorporated hereby reference.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to the deposition of inorganic conductive material, and more particularly to the selective deposition of these materials onto an organic diblock copolymer substrate.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF THE EMBODIMENTS OF THE INVENTION

Embodiments of the invention generally relate to the deposition of inorganic conductive material, and more particularly to the selective deposition of these materials onto an organic diblock copolymer substrate.

As the conductive material only deposits on one of the homopolymers in the copolymer system, the underlying diblock copolymer arrangement determines the shape of the conductive surface that will be deposited on top of the copolymer. The homopolymer constituents self assemble into one of a series of arrangements depending on the conditions under which the copolymer is formed. The orientation, conductivity, shape, size, and periodicity of the resulting conductive array define the strength and frequency of allowed surface waves that can absorb and radiate electromagnetic radiation away from the substrate.

Figure 3:
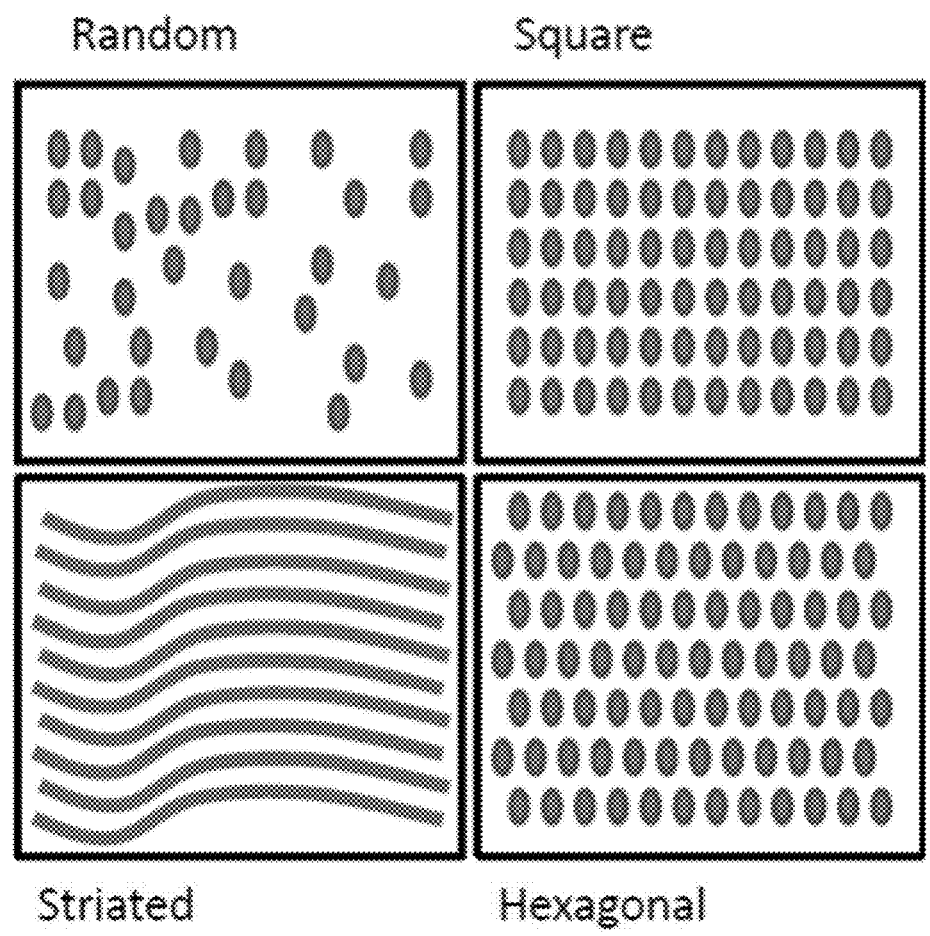
FIG. 3 is a top perspective view showing self assembled diblock copolymer surfaces, according to embodiments of the invention.

The diblock copolymer includes two monomeric building blocks. The two monomeric species aggregate into homopolymer regions. The homopolymer regions self assemble to generate an array of alternating materials. The common surface structures to observe include spheres, striated lamella, and periodic cylinders. FIG. 3 is a top perspective view showing self assembled diblock copolymer surfaces, according to embodiments of the invention. The arrays can assume hexagonal, square, or aperiodic packing at the copolymer surface. The final surface arrangement of homopolymer regions can be determined by copolymer mixing conditions including temperature, pressure, and monomeric building block concentrations.

The homopolymers have different surface functional groups. These different functional groups at the surface of the homopolymer region might include, but are not limited to, hydroxyl group, amino group, alkoxyl group, thiol groups, or a non-polar hydrocarbon chain. The functional group at the surface of the homopolymer can be inherent to the monomeric building block, or the result of post processing of the copolymer after self assembly has been allowed to occur.

Atomic layer deposition (ALD) is a gas phase deposition process that utilizes at least two gas phase precursors. The precursors are exposed to the substrate, onto which deposition is desired, one at a time. Generally, the different precursor exposures are separated temporally instead of spatially. ALD is defined by a self limiting growth behavior which is governed by available surface sites. The substrate is exposed to one precursor (Precursor A), and allowed to react until all available surface sites have been consumed. That precursor is removed, and a second precursor is introduced (Precursor B) that will now react with all of the surface sites that were created by Precursor A. Precursor B will react until all available surface sites have been reacted, and leave surface sites that are available for reaction with Precursor A. In this way a cyclic reaction can occur with repeating exposures to the A and B precursors.

By eliminating regions of active surface sites capable of reacting with Precursor A or Precursor B, the end user is limiting the regions in which deposition will occur. Homopolymer regions in a diblock copolymer can exhibit the surface site contrast that allows or inhibits ALD growth selectively. ALD materials that would be suitable for selective area deposition include, but are not limited to, tungsten, platinum, palladium, zinc oxide, vanadium oxide, zirconium oxide, tungsten nitride, tungsten silicide, aluminum zinc oxide, and titanium oxide.

The materials deposited using ALD procedures can be conductive depending on deposition conditions such as temperature, pressure, precursor type, precursor purity, post deposition annealing, or post deposition plasma treatment. The conductive materials can propagate a surface wave called a plasmon. The plasmons can couple with radiating electromagnetic radiation at specific frequencies in which the wave vector of the surface plasmon wave and the wave vector in free space overlap. The frequency of wave vector matching is determined by the surface wave dispersion behavior. The surface wave dispersion can be modified by the orientation, conductivity, shape, size, and periodicity of conductive material on the copolymer surface. As the homopolymer structure is self assembled in the copolymer, the conductive materials and therefore the plasmonic behavior, is defined in the same self assembly process.

The plasmonic surface wave generated on the surface has mixed character of an electronic wave and a light wave. This unique wave type has higher propagation speed than an electronic wave, but enhanced confinement over a light wave. The device range that can utilize such devices is large, and includes but is not limited to: interconnects, photovoltaics, gas sensors, pressure sensors, antennas, electromagnetic shielding, transparent conductive films, metamaterials, optics, and biomedical applications.

Figure 1:
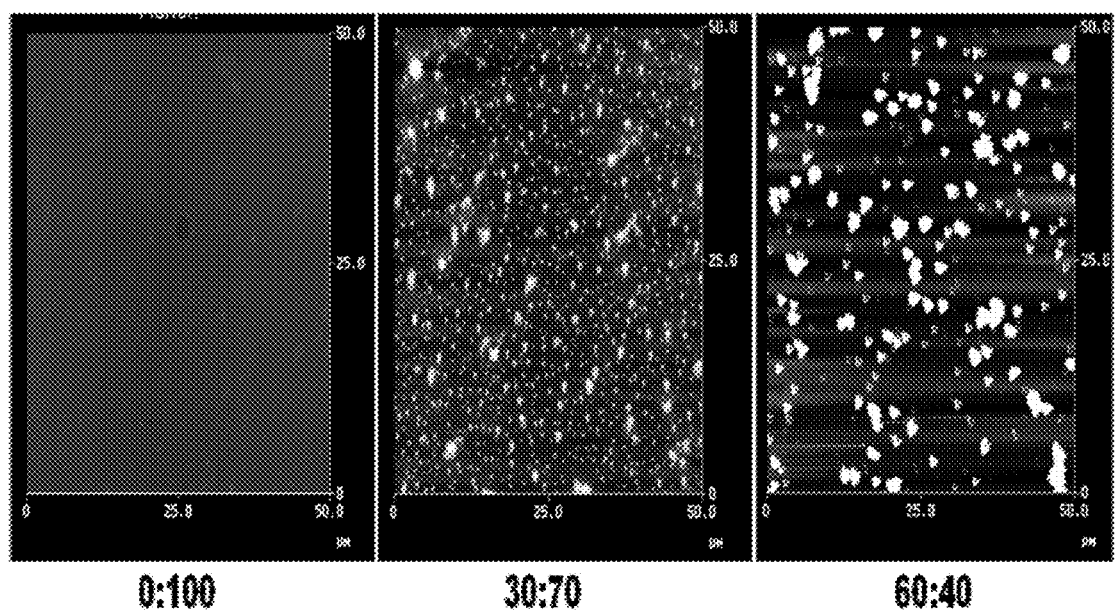
FIG. 1 are AFM images of the surface of 3 copolymers with varying starting concentrations of the homopolymer constituents, according to embodiments of the invention.

Brief summary of accomplishments: A diblock copolymer was formed using poly acrylic acid (PAA) and poly styrene (PS). Varying the concentration of the two polymer constituents led to a changing surface topography. An atomic force microscopy (AFM) was performed on all of the samples. Some of the images from the investigation are shown below in FIG. 1. FIG. 1. shows AFM images of the surface of 3 copolymers with varying starting concentrations of the homopolymer constituents. The ratio labeled in the bottom of the figure is the ratio of PS to PAA volumes in the starting mixture.

Figure 4:
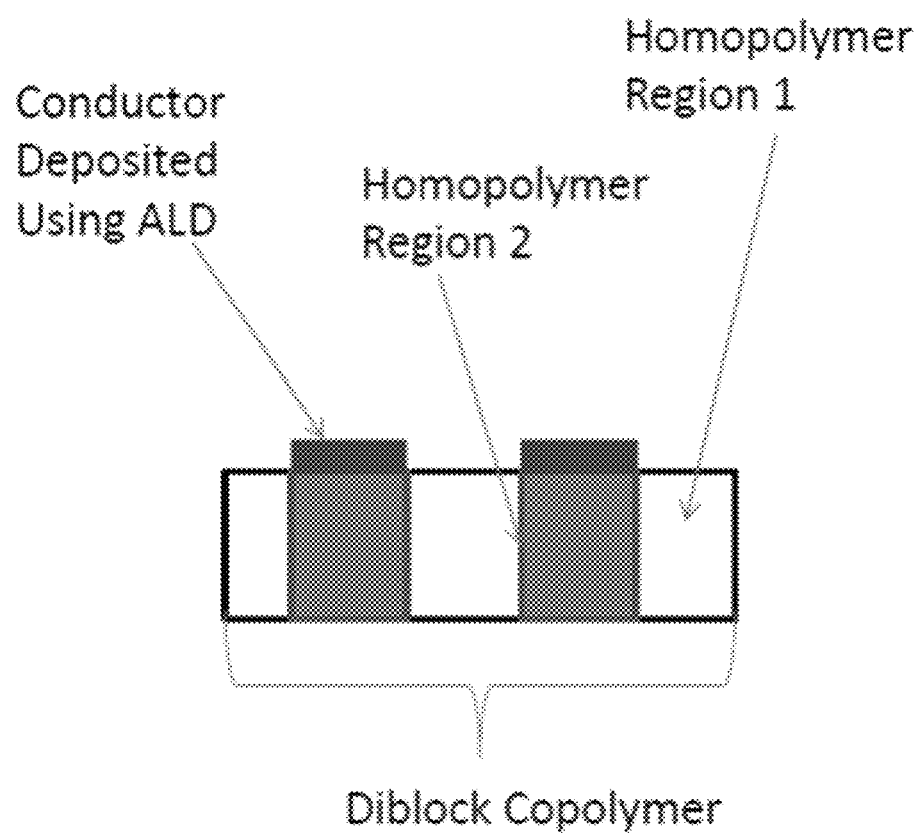
FIG. 4 is a side perspective view showing at least two homopolymer region embodiments, according to embodiments of the invention.

It was observed that varying the concentration of constituents led to a varied surface geometry in the copolymer. The x and y scale are distance measured in microns, and color scale is showing the phase lag between the driving piezoelectric crystal and the oscillating AFM tip tapping on the copolymer surface. Phase contrast in an image can arise from variation in composition, adhesion, friction, viscoelasticity, and perhaps other properties. The white regions in the AFM image had a different phase response to the oscillating AFM tip, and were assumed to be polystyrene spheres in a PAA matrix. FIG. 4 is a side perspective view showing at least two homopolymer region embodiments, according to embodiments of the invention.

Metal affinity for various regions was also examined. Platinum ALD chemistry was performed on dissimilar homopolymer constituents. Platinum ALD was performed using (methylcyclopentadienyl)trimethylplatinum and oxygen precursors. The homopolymers examined were poly acrylic acid and poly acrylic acid sodium salt. The results of deposition on these two surfaces can be seen in FIG. 2.

Figure 2:
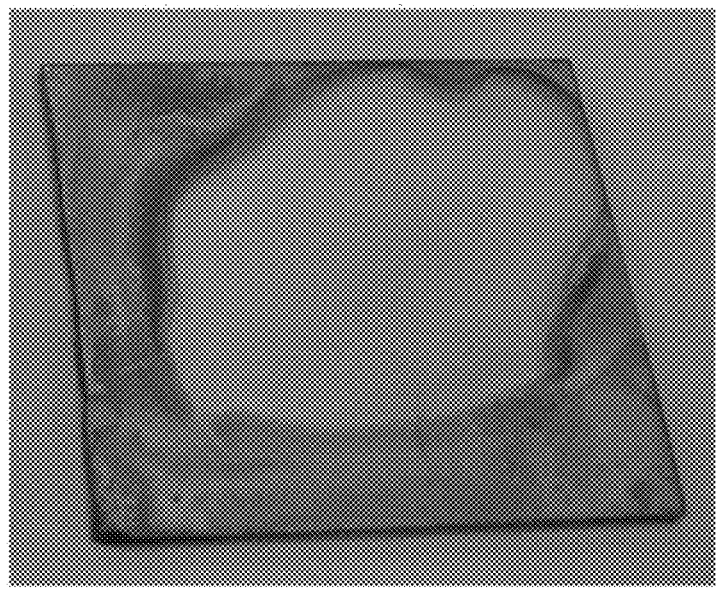
FIG. 2 are images showing the homopolymers in a drop on a 1" square piece of glass, according to embodiments of the invention.
Figure 2:
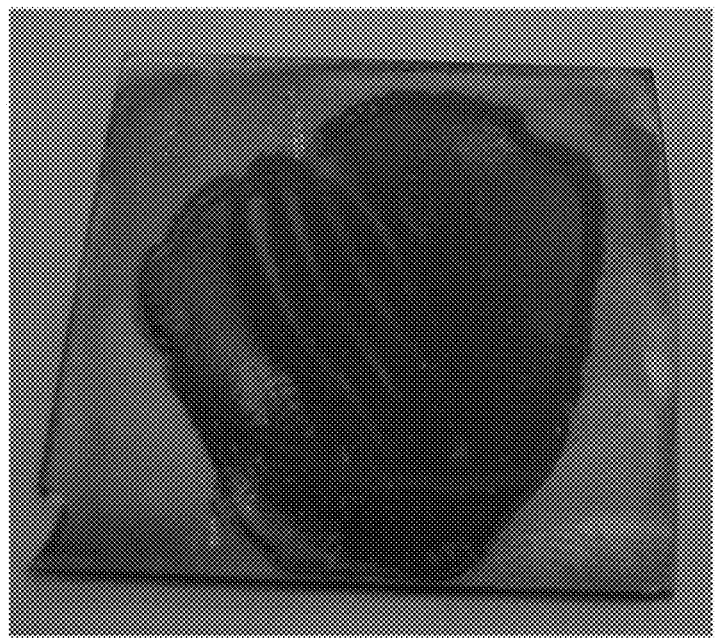

FIG. 2. Shows the homopolymers in a drop on a 1" square piece of glass. The glass and homopolymer samples were exposed to 250 cycles of platinum ALD. The platinum deposited on the glass and poly acrylic acid surfaces, but did not deposit on the poly acrylic acid sodium salt sample. The experiment demonstrates selective area ALD deposition on polymer substrates with dissimilar surface functionality. It is a good idea to protect using copolymer and ALD to deposit insulators, but they can't be used in a plasmonic system.

Embodiments of the invention generally relate to plasmonic structure(s) including, a copolymer including at least one distinct homopolymer blocks, where the copolymer having a surface generated using polymer processing procedures, where the homopolymer blocks each have surface exposure having homopolymers have different surface functional groups, where each surface functionality of the two homopolymers have dissimilar surface functionality, where the surfaces of the homopolymers will either bond or reject gas phase precursors based on the surface functionality, and where the surface of the homopolymers were subjected to gas phase precursors for inorganic materials allowing deposition of the inorganic material on at least one homopolymer and at least one homopolymer rejecting deposition.

In embodiments, the homopolymers are made of materials the same or independently of each other selected from the group consisting of poly acrylic acid, poly acrylic acid sodium salt polystyrene, polylactic acid, poly (methyl methacrylate), acetonitrile, styrene, butadiene, and any combination thereof. In embodiments, the functional groups are selected from the group consisting of hydroxyl group, amino group, alkyl group, aromatic group, thiol group, or a non-polar carbon chain, non-polar silicon chain, nitro group, phenyl group, carboxylic acid group, and any combination thereof. In embodiments, the deposition of gas phase precursors is by atomic layer deposition (ALD) that utilizes at least two gas phase precursors. In embodiments, the inorganic materials suitable for selective area deposition are selected from the group consisting of tungsten, platinum, palladium, zinc oxide, vanadium oxide, zirconium oxide, tungsten nitride, tungsten silicide, aluminum zinc oxide, and titanium oxide.

In embodiments, the plasmonic structures are a self patterning array. In embodiments, the homopolymer surfaces self assemble to generate an array of alternating materials having surface structures including spheres, striated lamella, gyroid and periodic cylinders and any combination thereof or independently. In other embodiments, the arrays are selected from the group consisting of hexagonal, square, aperiodic packing at the copolymer surface, and any combination thereof.

Another aspect of the invention generally relate to methods for self patterning plasmonic structures including, forming a copolymer having at least two distinct homopolymers, where the homopolymers of the copolymer each having surface exposure, bonding at least one functional group to each homopolymer surface providing distinct surface functionalities, where at least two homopolymers having dissimilar surface functionality, where at least one homopolymer surface is receptive to inorganic material deposition, subjecting the surface of each the homopolymer to a gas phase deposition process that utilizes at least two gas phase precursors, where each gas phase precursor includes inorganic material to be deposited onto each homopolymer surface based on surface functionality, depositing the inorganic material in the form of specific patterns depending on utility of the plasmonic structure(s).

In embodiments, the gas phase deposition process includes Atomic Layer Deposition (ALD). In embodiments, the structure is a diblock copolymer. In embodiments, the deposition on the homopolymer will create a chemically bonded layer of inorganic material. In embodiments, at least one homopolymer having hydrophobic region and/or at least one homopolymer having hydrophilic region(s). Embodiments further include forming the diblock copolymer consisting of two homopolymer materials existing periodically aligned in an array. Other embodiments further include forming the diblock copolymer having said surfaces of at least two homopolymers in contact with each other without overlap. In embodiments, the gas phase precursors having compatibility with the hydrophobic homopolymer will only deposit on the hydrophobic region(s).

Embodiments further include alternating the gas exposures used in atomic layer deposition processing to introduce the gas phase precursor to the diblock copolymer surface. In embodiments, the plasmonic structures that can be deposited onto are selected from the group consisting of oxides, nitrides, silicides, metals, semiconductors, and any combination thereof. In embodiments, the inorganic material exhibits conductive behavior and is selectively deposited onto the patterned diblock copolymer substrate will permit plasmonic wave propagation on the surface. In other embodiments, the plasmonic behavior of the patterned conductor of the ALD will be modified by the pattern of deposited material, which is determined by the pattern of the underlying diblock copolymer. In embodiments, the structures are utilized for applications selected from the groups consisting of gas sensors, frequency selective surfaces, flexible conductors, transparent conductors, general radiation manipulation including transmission, reflection, absorption, and any combination thereof.

In embodiments, the gas phase precursors having compatibility with the hydropillic homopolymer will only deposit on the hydropillic region(s). Another aspect of the invention generally relates to plasmonic structures produced by the methods herein.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A plasmonic structure(s), comprising:
 a self patterning copolymer array including at least two distinct hydrophobic and hydrophilic homopolymer blocks, wherein said copolymer having a surface generated by using polymer processing procedures, wherein said homopolymer blocks have complimentary surface functionality, wherein said hydrophobic homopolymer blocks without hydroxylated or carboxylated functionalities that reject incident gas phase precursors or hydrophilic homopolymer blocks having hydroxylated or carboxylated functionalities that accept incident gas phase precursors, wherein said surfaces of said homopolymers will either bond or reject gas phase precursors based on said surface functionality; and wherein said surface of said homopolymers were subjected to gas phase precursors for inorganic materials allowing deposition of said inorganic material on at least one homopolymer with at least one homopolymer rejecting deposition.

2. The plasmonic structures according to claim 1, wherein said hydrophobic homopolymer blocks without hydroxylated or carboxylated functionalities being selected from the group consisting of acetonitrile, styrene, butadiene, and any combination thereof.

3. The plasmonic structures according to claim 1, wherein said deposition of gas phase precursors is by atomic layer deposition (ALD) that utilizes at least two gas phase precursors.

4. The plasmonic structures according to claim 1, wherein said inorganic materials suitable for selective area deposition are selected from the group consisting of tungsten, platinum, palladium, zinc oxide, vanadium oxide, zirconium oxide, tungsten nitride, tungsten silicide, aluminum zinc oxide, and titanium oxide.

5. The plasmonic structures according to claim 1, wherein said plasmonic structures are a self patterning array which comprises similar or varying homopolymer blocks, wherein at least one hydrophilic homopolymer blocks accepting deposition shows a plasmonic response.

6. The plasmonic structures according to claim 5, wherein said homopolymer surfaces self assemble to generate an array of alternating materials having surface structures including spheres, striated lamella, gyroid and periodic cylinders and any combination thereof or independently.

7. The plasmonic structures according to claim 5, wherein said arrays are selected from the group consisting of hexagonal, square, aperiodic packing at the copolymer surface, and any combination thereof.

8. The plasmonic structures according to claim 1, wherein said hydrophilic homopolymer blocks with carboxylated functionalities are selected from the group consisting of acrylic acid, methacrylic acid, and any combination thereof.

9. The plasmonic structures according to claim 1, wherein said hydrophobic homopolymer blocks without hydroxylated or carboxylated functionalities selected from the group consisting of acrylic acid sodium salt

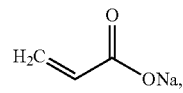

methacrylic acid sodium salt

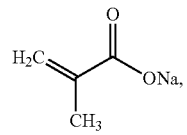

or any salt combination thereof.

10. The plasmonic structures according to claim 1, wherein said hydrophilic homopolymer blocks with hydroxylated functionalities selected from the group consisting of vinyl alcohols

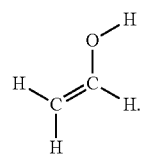

* * * * *